United States Patent
Hayashi et al.

(10) Patent No.: US 9,543,412 B2
(45) Date of Patent: Jan. 10, 2017

(54) METHOD FOR MANUFACTURING SILICON CARBIDE SEMICONDUCTOR DEVICE

(71) Applicant: Sumitomo Electric Industries, Ltd., Osaka-shi (JP)

(72) Inventors: Hideki Hayashi, Osaka (JP); Takeyoshi Masuda, Osaka (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 0 days.

(21) Appl. No.: 14/740,812

(22) Filed: Jun. 16, 2015

(65) Prior Publication Data

US 2015/0279967 A1 Oct. 1, 2015

Related U.S. Application Data

(63) Continuation of application No. 13/958,115, filed on Aug. 2, 2013, now Pat. No. 9,087,693.

(Continued)

(30) Foreign Application Priority Data

Sep. 12, 2012 (JP) ................................. 2012-200178

(51) Int. Cl.
*H01L 29/66* (2006.01)
*H01L 29/78* (2006.01)
(Continued)

(52) U.S. Cl.
CPC ... *H01L 29/66666* (2013.01); *H01L 21/02529* (2013.01); *H01L 21/02636* (2013.01);
(Continued)

(58) Field of Classification Search
None
See application file for complete search history.

(56) References Cited

U.S. PATENT DOCUMENTS 5,473,176 A 12/1995 Kakumoto
5,637,898 A 6/1997 Baliga
(Continued)

FOREIGN PATENT DOCUMENTS

CN 1 360735 A 7/2002
CN 101238581 A 8/2008
(Continued)

OTHER PUBLICATIONS

JP2009-224365 machine translation.*
(Continued)

*Primary Examiner* — Mary Wilczewski
*Assistant Examiner* — Erik T Peterson
(74) *Attorney, Agent, or Firm* — Venable LLP; Michael A. Sartori; Tamatane J. Aga

(57) ABSTRACT

A silicon carbide substrate including a first layer having first conductivity type, a second layer having second conductivity type, and a third layer having the first conductivity type is formed. A trench provided with an inner surface having a side wall surface and a bottom surface is formed, the side wall surface extending through the third layer and the second layer and reaching the first layer, the bottom surface being formed of the first layer. A silicon film is formed to cover the bottom surface. A gate oxide film is formed on the inner surface by oxidation in the trench. The gate oxide film includes a first portion formed by oxidation of the silicon carbide substrate, and a second portion formed by oxidation of the silicon film on the bottom surface. Accordingly, a method for manufacturing a silicon carbide semiconductor device having a high breakdown voltage is provided.

9 Claims, 13 Drawing Sheets

Related U.S. Application Data

(60) Provisional application No. 61/700,069, filed on Sep. 12, 2012.

(51) Int. Cl.
```
H01L 21/308      (2006.01)
H01L 21/3065     (2006.01)
H01L 21/04       (2006.01)
H01L 29/423      (2006.01)
H01L 21/28       (2006.01)
H01L 29/739      (2006.01)
H01L 29/51       (2006.01)
H01L 21/02       (2006.01)
H01L 29/16       (2006.01)
H01L 29/40       (2006.01)
H01L 29/04       (2006.01)
```

(52) U.S. Cl.
CPC ...... *H01L 21/049* (2013.01); *H01L 21/28255* (2013.01); *H01L 21/308* (2013.01); *H01L 21/3065* (2013.01); *H01L 29/1608* (2013.01); *H01L 29/4236* (2013.01); *H01L 29/42368* (2013.01); *H01L 29/511* (2013.01); *H01L 29/66068* (2013.01); *H01L 29/7397* (2013.01); *H01L 29/7813* (2013.01); *H01L 29/045* (2013.01); *H01L 29/407* (2013.01); *H01L 29/66734* (2013.01)

(56) References Cited

U.S. PATENT DOCUMENTS

| | | | |
|---|---|---|---|
| 5,744,826 | A | 4/1998 | Takeuchi et al. |
| 5,915,180 | A | 6/1999 | Hara et al. |
| 5,976,936 | A | 11/1999 | Miyajima et al. |
| 5,998,833 | A | 12/1999 | Baliga |
| 7,005,351 | B2 | 2/2006 | Henninger et al. |
| 7,648,877 | B2 | 1/2010 | Andrews |
| 2001/0052617 | A1 | 12/2001 | Kitada et al. |
| 2004/0031987 | A1 | 2/2004 | Henninger et al. |
| 2004/0089910 | A1 | 5/2004 | Hirler et al. |
| 2004/0180510 | A1 | 9/2004 | Ranade et al. |
| 2005/0167742 | A1 | 8/2005 | Challa et al. |
| 2006/0014349 | A1 | 1/2006 | Williams et al. |
| 2006/0166419 | A1 | 7/2006 | Shimoyama et al. |
| 2007/0037327 | A1 | 2/2007 | Herrick et al. |
| 2007/0138546 | A1 | 6/2007 | Kawamura et al. |
| 2007/0187695 | A1 | 8/2007 | Nakamura et al. |
| 2007/0190712 | A1 | 8/2007 | Lin et al. |
| 2008/0150015 | A1 | 6/2008 | Cho |
| 2009/0078995 | A1 | 3/2009 | Nakagawa et al. |
| 2009/0111231 | A1 | 4/2009 | Grebs et al. |
| 2009/0261420 | A1 | 10/2009 | Ryu et al. |
| 2009/0315083 | A1 | 12/2009 | Pan et al. |
| 2009/0321817 | A1 | 12/2009 | Hunt |
| 2010/0006928 | A1 | 1/2010 | Pan et al. |
| 2010/0019250 | A1 | 1/2010 | Nakamura et al. |
| 2010/0065904 | A1 | 3/2010 | Pan et al. |
| 2010/0184095 | A1 | 7/2010 | Haketa et al. |
| 2010/0193799 | A1 | 8/2010 | Nakano et al. |
| 2010/0314626 | A1 | 12/2010 | Harada et al. |
| 2010/0320534 | A1 | 12/2010 | Pan et al. |
| 2011/0068353 | A1 | 3/2011 | Nakano |
| 2011/0136309 | A1 | 6/2011 | Grivna et al. |
| 2011/0136310 | A1 | 6/2011 | Grivna |
| 2011/0303975 | A1 | 12/2011 | Yilmaz et al. |
| 2012/0025304 | A1 | 2/2012 | Blank et al. |
| 2012/0049202 | A1 | 3/2012 | Nakano |
| 2012/0184095 | A1 | 7/2012 | Poelzl |
| 2012/0217577 | A1 | 8/2012 | Hashimoto et al. |
| 2012/0228640 | A1 | 9/2012 | Masuda et al. |
| 2012/0235229 | A1 | 9/2012 | Probst |

FOREIGN PATENT DOCUMENTS

| | | | |
|---|---|---|---|
| CN | 1 01558499 A | | 10/2009 |
| JP | H07122749 A | | 5/1995 |
| JP | 07-326755 A | | 12/1995 |
| JP | 2003-318392 A | | 11/2003 |
| JP | 2006-203007 A | | 8/2006 |
| JP | 2007-194283 A | | 8/2007 |
| JP | 2009-505403 A | | 2/2009 |
| JP | 2009-224365 | * | 10/2009 |
| JP | 2009-224365 A | | 10/2009 |
| JP | 2010-129820 A | | 6/2010 |
| JP | 2010-263104 A | | 11/2010 |
| JP | 2011-216783 A | | 10/2011 |
| WO | WO-00/72372 A1 | | 11/2000 |
| WO | WO-2007/001988 A2 | | 1/2007 |
| WO | WO-2009/142233 A1 | | 11/2009 |
| WO | WO-2012/098861 A1 | | 7/2012 |
| WO | WO-2012/105170 A1 | | 8/2012 |

OTHER PUBLICATIONS

Office Action in U.S. Appl. No. 13/958,073, dated May 6, 2014.
T. Nakamura et al., "High Performance SiC Trench Devices with Ultra-low Ron," Electron Devices Meeting (IEDM), 2011 IEEE International, pp. 26.5.1-26.5.3.
Saitoh et al., U.S. Appl. No. 13/958,151, filed Aug. 2, 2013.
Masuda et al., U.S. Appl. No. 13/958,073, filed Aug. 2, 2013.
International Search Report and Written Opinion in PCT International Application No. PCT/JP2013/068399, dated Oct. 8, 2013.
International Search Report and Written Opinion in PCT International Application No. PCT/JP2013/068400, dated Oct. 8, 2013.
H. Jansen et al., "A survey on the reactive ion etching of silicon in microtechnology," J. Micromech. Microeng. 6, (1996), pp. 14-28.
Y. Song et al., "Modified Deal Grove model for the thermal oxidation of silicon carbide," Journal of Applied Physics 95, (2004), pp. 4953-4957.
Office Action in U.S. Appl. No. 13/958,151, dated Oct. 9, 2013.
International Search Report and Written Opinion in PCT International Application No. PCT/JP2013/070575, dated Nov. 5, 2013.
Vathulya et al., "On the correlation between the carbon content and the electrical quality of thermally grown oxides on p-type 6H-silicon carbide," Applied Physics Letters, vol. 73, pp. 2161-2163, (1998).
Office Action in U.S. Appl. No. 13/958,151 dated May 5, 2014.
Office Action in U.S. Appl. No. 13/958,115, dated May 9, 2014.
Chang et al., "Nanoscale Characterization of the Silicon Dioxide-Silicon Carbide Interface Using Elemental Mapping by Energy-Filtered Transmission Electron Microscopy", Journal Electronic Materials, vol. 32, No. 5, 2003, pp. 464-469.
Poggi et al., "Characterization of a thermal oxidation process on SiC preamorphized by Ar ion implantation", Materials Science Forum, vols. 457-460 (2004), pp. 1357-1360.
Chaudhry et al., A study of native oxides of beta-SiC using Auger electron spectroscopy, J. Mater. Res., vol. 4, No. 2, Mar./Apr. 1989, pp. 404-407.
Akashi et al., SIMS study of SiC single crystal oxidized in atmosphere containing isotopic water vapor, Journal of the Ceramic Society of Japan, vol. 116, No. 1357, (2008) pp. 960-964.
Lu et al., "Thermal Oxidation of Sputtered Silicon Carbide Thin Films", J. Electrochem. Soc. 1984, vol. 131, Issue 8, pp. 1907-1914.
Chang et al., High-carbon concentrations at the silicon dioxide-silicon carbide interface identified by electron energy loss spectroscopy, Appl. Phys. Lett. 77, 2000, pp. 2186-2188.
Hijikata et al., Composition analysis of SiO2/SiC interfaces by electron spectroscopic measurements using slope-shaped oxide films, Applied Surface Science, vol. 184, 2001, pp. 161-166.
Advisory Action in U.S. Appl. No. 13/958,073, dated May 11, 2015.
Decision to Grant Patent in Japanese Patent Application No. 2012-200178, dated Aug. 25, 2015.
Notice of Grounds of Rejection in Japanese Patent Application No. 2012-200179, dated Aug. 25, 2015.
Extended European Search Report in European Patent Application No. 13836438.5, dated Apr. 20, 2016.

(56) References Cited

OTHER PUBLICATIONS

Extended European Search Report in European Patent Application No. 13836826.1, dated Apr. 20, 2016.
Extended European Search Report in European Patent Application No. 13836475.7, dated May 2, 2016.
Notice of Grounds of Rejection in Japanese Patent Application No. 2012-200179, dated Apr. 5, 2016.
Notice of Grounds of Rejection in Japanese Patent Application No. 2012-200180, dated May 17, 2016.
Ueno, "Orientation Dependence of the Oxidation of SiC Surfaces," Physica Status Solidi (A). Appled Research, vol. 162, No. 1, Jul. 1, 1997.
Notification of First Office Action in Chinese Patent Application No. 201380040551.4, dated Aug. 2, 2016.
Notification of First Office Action in Chinese Patent Application No. 201380042640.2, dated Aug. 22, 2016.

* cited by examiner

METHOD FOR MANUFACTURING SILICON CARBIDE SEMICONDUCTOR DEVICE

CROSS REFERENCE TO RELATED APPLICATIONS

This application is a Continuation of U.S. patent application Ser. No. 13/958,115, filed Aug. 2, 2013, which claims the benefit of U.S. Provisional Patent Application No. 61/700,069, filed Sep. 12, 2012 and Japanese Patent Application No. 2012-200178, filed Sep. 12, 2012.

BACKGROUND OF THE INVENTION

Field of the Invention

The present invention relates to methods for manufacturing silicon carbide semiconductor devices, and particularly to a silicon carbide semiconductor device having a trench and a method for manufacturing the same.

Description of the Background Art

Japanese Patent Laying-Open No. 7-326755 discloses a silicon carbide semiconductor device having a trench. This patent publication states that a gate thermal oxidation film has a larger film thickness on a bottom surface of a trench than the film thickness thereof on a side surface of the trench, so that a threshold voltage becomes low and breakdown voltage between the gate and the drain becomes high. It is also stated that the bottom surface of the trench corresponds to a carbon plane, which allows for fast oxidation rate, of hexagonal single-crystal silicon carbide, whereas the side surface of the trench corresponds to a plane perpendicular to this carbon plane and allowing for slow oxidation rate. Hence, by performing a thermal oxidation process once, a thermal oxidation film can be formed such that the thickness of the thermal oxidation film on the side surface of the trench is greatly different from the thickness of the thermal oxidation film on the bottom surface of the trench.

According to a study conducted by the present inventors, however, it was difficult to selectively increase the film thickness of a gate oxide film to a sufficient degree on a bottom surface of a trench merely by using the difference in oxidation rate of silicon carbide dependent on the crystal orientation.

SUMMARY OF THE INVENTION

The present invention has been made to solve the problems as described above, and an object of the present invention is to provide a method for manufacturing a silicon carbide semiconductor device having a high breakdown voltage.

A method for manufacturing a silicon carbide semiconductor device of the present invention includes the following steps. A silicon carbide substrate including a first layer having first conductivity type, a second layer provided on the first layer and having second conductivity type, and a third layer provided on the second layer, separated from the first layer by the second layer, and having the first conductivity type is formed. A trench provided with an inner surface having a side wall surface and a bottom surface is formed, the side wall surface extending through the third layer and the second layer and reaching the first layer, the bottom surface being formed of the first layer. A silicon film is formed to cover the bottom surface. A gate oxide film is formed on the inner surface by oxidation in the trench. The gate oxide film includes a first portion formed by oxidation of the silicon carbide substrate, and a second portion formed by oxidation of the silicon film on the bottom surface. A gate electrode is formed on the gate oxide film.

According to this manufacturing method, the gate oxide film includes the first portion formed by the oxidation of the silicon carbide substrate, as well as the second portion formed by the oxidation of the silicon film on the bottom surface of the trench. Thus, the thickness of the gate oxide film on the bottom surface of the trench can be increased for the thickness of the second portion. Accordingly, the silicon carbide semiconductor device can have a high breakdown voltage.

Preferably, the gate electrode is formed such that the gate electrode makes direct contact with the first portion on the second layer. Thus, the gate insulating film on the channel surface formed of the second layer can be formed only of the first portion higher in quality than the second portion.

The silicon film may be formed to cover the second layer on the side wall surface. Subsequently, a portion of the silicon film may be removed such that the silicon film remains on the bottom surface of the trench and the second layer is exposed at the side wall surface of the trench.

Thus, even if the second layer is covered with the silicon film when the silicon film is formed, the second portion is not formed on the second layer. Thus, the gate electrode can make direct contact with the first portion on the second layer.

Preferably, the silicon film is formed such that the silicon film has a first thickness on the bottom surface and has a second thickness on the side wall surface formed of the second layer. The first thickness is larger than the second thickness.

Thus, the second portion can be formed with a further sufficient thickness on the bottom surface.

Preferably, the step of removing a portion of the silicon film includes the following steps. The silicon film is oxidized for a thickness smaller than the first thickness and larger than the second thickness. A portion of the silicon film that has been oxidized in the step of oxidizing the silicon film is removed.

Thus, the second portion can be selectively formed on the bottom surface rather than on the side wall surface.

Preferably, the step of forming a trench includes the following steps. A mask having an opening is formed on the third layer. The silicon carbide substrate is etched using the mask. The step of forming a silicon film is performed using the mask.

Thus, the formation of the silicon film on the portion covered with the mask can be prevented.

Preferably, the silicon carbide substrate is etched such that the silicon carbide substrate is side-etched from the opening of the mask.

Thus, the side wall surface of the trench is recessed by the side etching. As a result, the mask remains protruding from the side wall surface. During the formation of the silicon film using this mask, therefore, the silicon film is unlikely to be formed on the side wall surface since the side wall surface is located in the shadow of the mask.

Preferably, the step of etching the silicon carbide substrate includes the step of thermally etching the silicon carbide substrate.

Thus, the silicon carbide substrate can be side-etched.

As described above, according to the present invention, the silicon carbide semiconductor device can have a high breakdown voltage.

The foregoing and other objects, features, aspects and advantages of the present invention will become more

DESCRIPTION OF THE PREFERRED EMBODIMENTS

Embodiments of the present invention will be described hereinafter with reference to the drawings, in which the same or corresponding parts are designated by the same reference numbers and description thereof will not be repeated. Regarding crystallographic descriptions in the present specification, an individual orientation is represented by [ ], a group orientation is represented by < >, an individual plane is represented by ( ) and a group plane is represented by { }. In addition, although a negative crystallographic index is usually indicated by putting "-" (bar) above a numeral, it is indicated by putting a negative sign before the numeral in the present specification.

Figure 1:
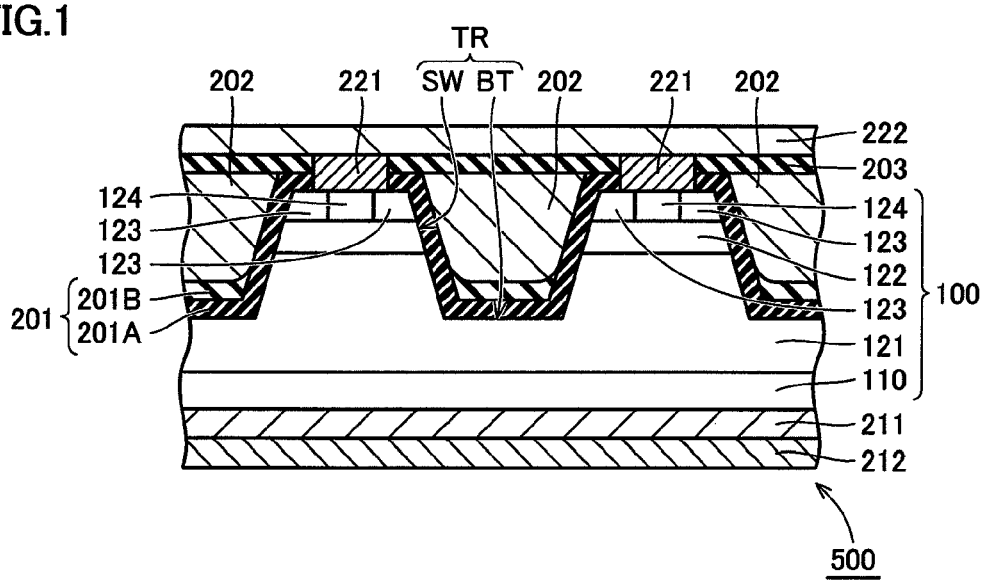
FIG. 1 is a partial cross sectional view schematically showing the configuration of a silicon carbide semiconductor device in one embodiment of the present invention.

As shown in FIG. 1, a vertical type MOSFET 500 (silicon carbide semiconductor device) of the present embodiment includes an epitaxial substrate 100 (silicon carbide substrate), gate oxide films 201 (gate insulating films), gate electrodes 202, interlayer insulating films 203, source electrodes 221, a drain electrode 211, a source interconnection 222, and a protecting electrode 212.

Epitaxial substrate 100 has a single-crystal substrate 110 and an epitaxial layer provided thereon. The epitaxial layer includes an n⁻ layer 121 (first layer), p type body layers 122 (second layer), n regions 123 (third layer), and contact regions 124. Epitaxial substrate 100 is made of silicon carbide. This silicon carbide preferably has a hexagonal crystal structure, and more preferably has a polytype of 4H.

Single-crystal substrate 110 has n type conductivity (first conductivity type). The plane orientation (hklm) of one main surface (upper surface in FIG. 1) of single-crystal substrate 110 preferably has m of negative value, more preferably, corresponds to approximately a (000-1) plane.

N⁻ layer 121 has a donor added therein and therefore has n type conductivity. The donor is preferably added to n⁻ layer 121 during epitaxial growth of n⁻ layer 121, rather than by ion implantation. N⁻ layer 121 preferably has a donor concentration lower than that of single-crystal substrate 110. N⁻ layer 121 preferably has a donor concentration of not less than $1\times10^{15}$ cm$^{-3}$ and not more than $5\times10^{16}$ cm$^{-3}$, for example, has a donor concentration of $8\times10^{15}$ cm$^{-3}$.

Each of p type body layers 122 is provided on n⁻ layer 121, has an acceptor added therein, and therefore has p type conductivity (second conductivity type). P type body layer 122 has an acceptor concentration of, for example, $1\times10^{18}$ cm$^{-3}$.

Each of n regions 123 has n type conductivity. N region 123 is provided on p type body layer 122, and is separated from n⁻ layer 121 by p type body layer 122. Contact region 124 has p type conductivity. Contact region 124 is formed on a portion of p type body layer 122 so as to be connected to p type body layer 122.

Figure 2:
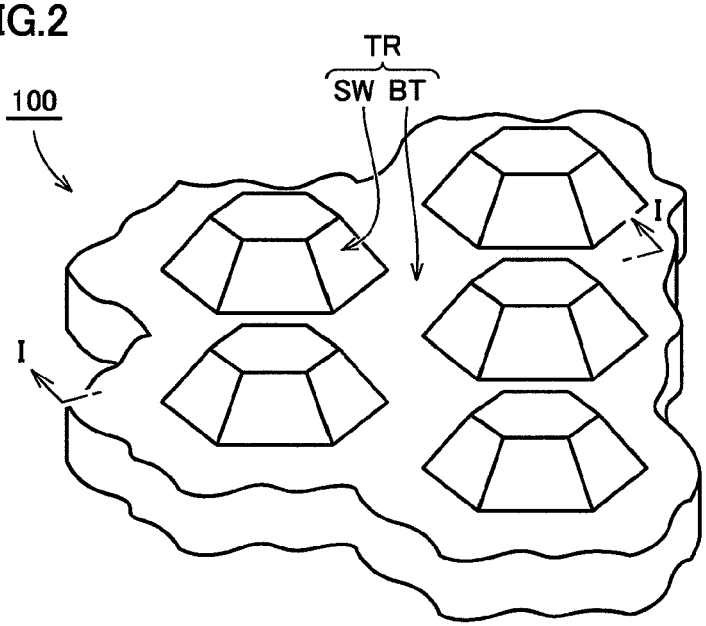
FIG. 2 is a perspective view schematically showing the shape of a silicon carbide substrate included in the silicon carbide semiconductor device of FIG. 1.
Figure 3:
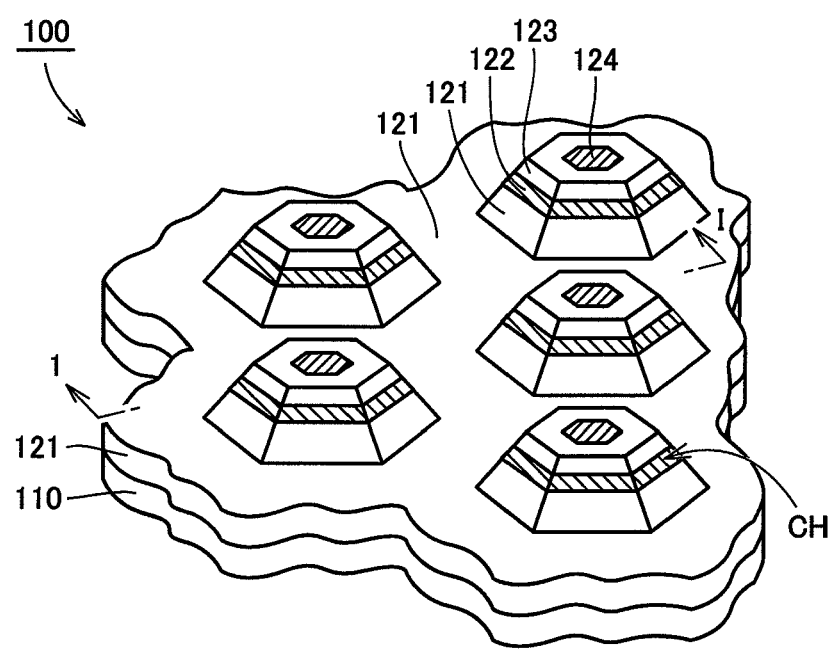
FIG. 3 shows the configuration of FIG. 2 in more detail.

Further, referring to FIG. 2 and FIG. 3, epitaxial substrate 100 has a trench TR provided with an inner surface having side wall surfaces SW and a bottom surface BT. Each of side wall surfaces SW extends through n region 123 and p type body layer 122 and reaches n⁻ layer 121. Bottom surface BT is formed of n⁻ layer 121. Side wall surface SW has a channel surface CH (FIG. 3) on p type body layer 122. Preferably, side wall surface SW has a predetermined crystal plane (also referred to as "special plane") particularly on p type body layer 122. Details of the special plane will be described later.

The fact that epitaxial substrate 100 has trench TR corresponds to such a fact that the epitaxial layer is partially removed above the upper surface of single-crystal substrate 110. In the present embodiment, a multiplicity of mesa structures are formed on the upper surface of single-crystal substrate 110. Specifically, each of the mesa structures has an upper surface and a bottom surface both having a hexagonal shape, and has side walls inclined relative to the upper surface of single-crystal substrate 110. Thus, trench TR expands in a tapered shape toward the opening.

Figure 4:
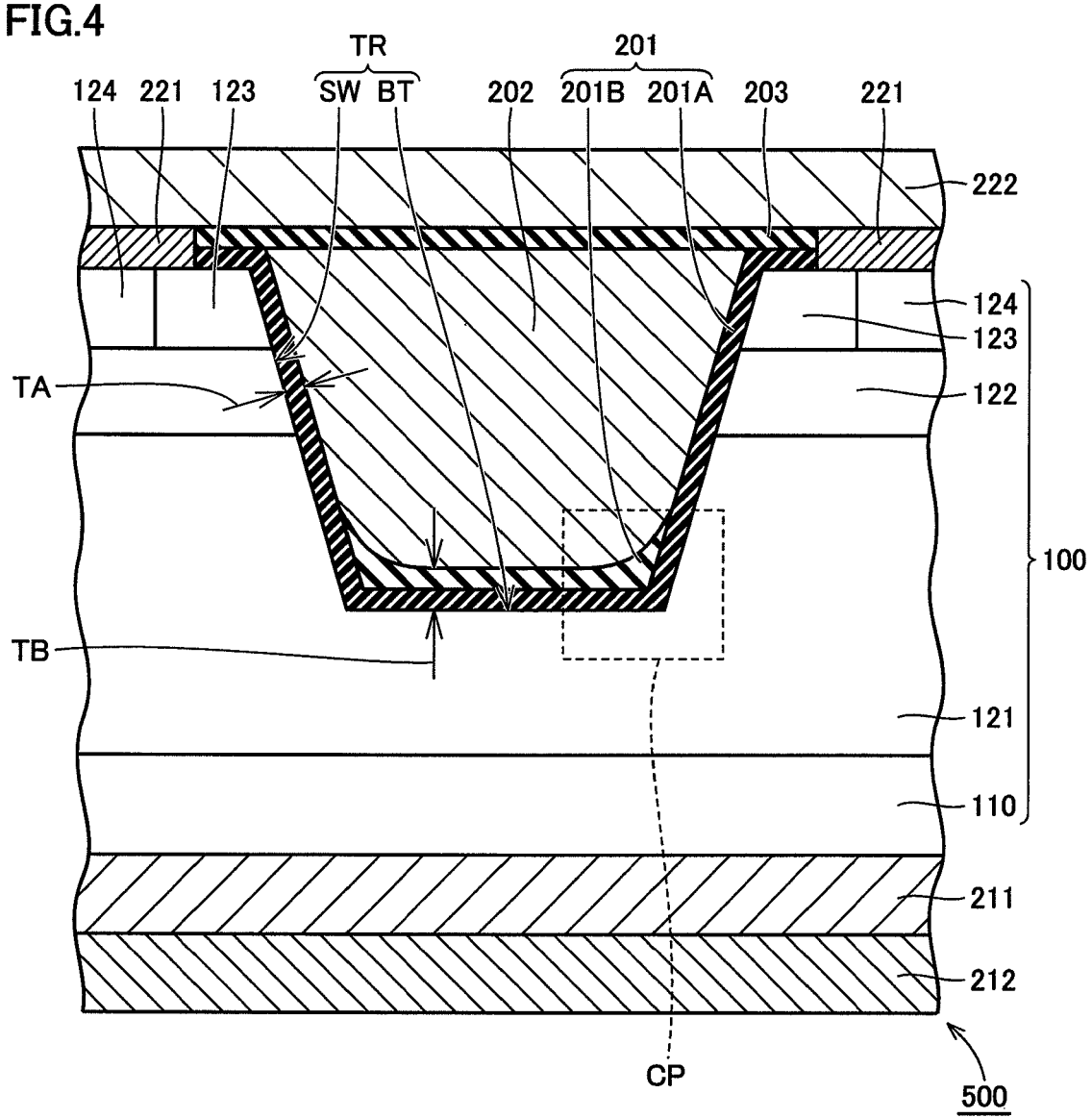
FIG. 4 is an enlarged view of FIG. 1.

Gate oxide film 201 (FIG. 1) covers the inner surface of trench TR, namely, side wall surfaces SW and bottom surface BT. Gate oxide film 201 has a thickness TA (FIG. 4) on side wall surface SW formed of p type body layer 122. Gate oxide film 201 also has a thickness TB (FIG. 4) on bottom surface BT. Thickness TB is larger than thickness TA. Preferably, thickness TB is larger than thickness TA by 300 nm or more.

Gate oxide film 201 includes a first portion 201A formed by thermal oxidation of silicon carbide, and a second portion 201B formed by thermal oxidation of silicon. At least a portion of second portion 201B is provided on bottom surface BT of trench TR with first portion 201A interposed therebetween.

Second portion 201B has a carbon atom concentration lower than that of first portion 201A. First portion 201A may have a carbon atom concentration of more than $1 \times 10^{15}$ cm$^{-3}$. Second portion 201B preferably has a carbon atom concentration of less than $1 \times 10^{15}$ cm$^{-3}$. It should be noted that in the case where the carbon atom concentrations are not uniform, an average value may be calculated.

Figure 5:
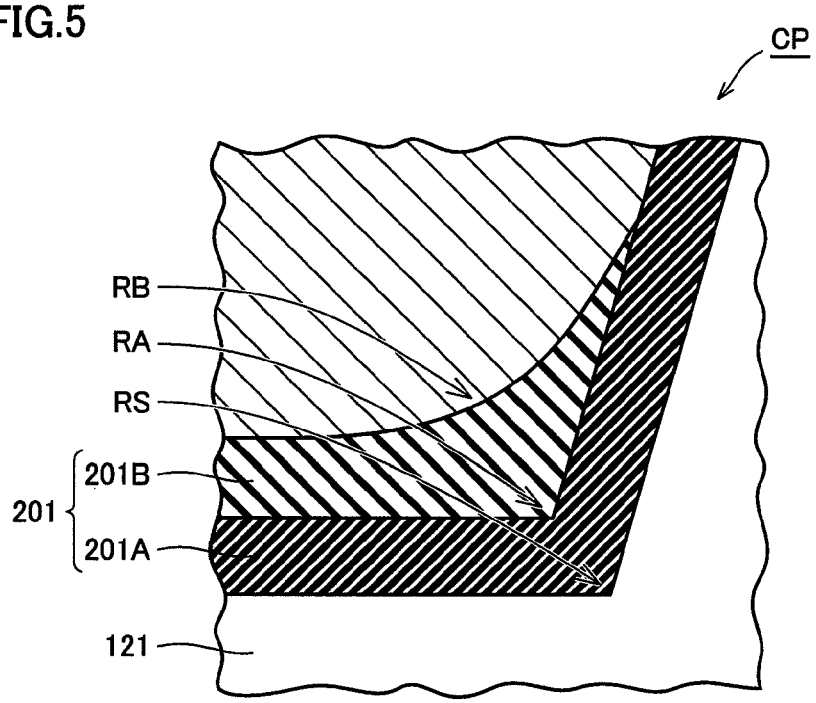
FIG. 5 is an enlarged view of a broken line CP of FIG. 4.

A portion where bottom surface BT and side wall surface SW of trench TR are connected to each other forms a corner portion RS (FIG. 5). First portion 201A provided on corner portion RS forms a corner portion RA having a radius of curvature approximately similar to that of corner portion RS. Second portion 201B provided on corner portion RA forms a corner portion RB having a radius of curvature greater than that of corner portion RA. Thus, an electric field is relaxed in corner portion RB.

Gate electrode 202 is buried in trench TR with gate oxide film 201 interposed therebetween. Gate oxide film 201 separates epitaxial substrate 100 and gate electrode 202 from each other in trench TR. Gate electrode 202 faces the surface of p type body layer 122 with gate oxide film 201 interposed therebetween. Gate electrode 202 has an upper surface substantially as high as the upper surface of a portion of gate oxide film 201 on the upper surface of n region 123. Interlayer insulating film 203 is provided to cover gate electrode 202 as well as the extended portion of gate oxide film 201 on the upper surface of n region 123.

Source electrode 221 extends through interlayer insulating film 203 and makes contact with each of n region 123 and contact region 124. Source interconnection 222 is provided on source electrode 221 and interlayer insulating film 203 in contact with source electrode 221. Drain electrode 211 is provided on an opposite surface of epitaxial substrate 100 to its surface in which trench TR is provided. Protecting electrode 212 covers drain electrode 211.

A method for manufacturing MOSFET 500 (FIG. 1) is now described.

Figure 6:
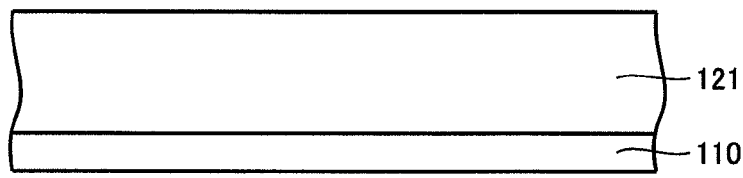
FIG. 6 is a partial cross sectional view schematically showing a first step of a method for manufacturing the silicon carbide semiconductor device of FIG. 1.

As shown in FIG. 6, on single-crystal substrate 110, n⁻ layer 121 is formed by means of epitaxial growth. This epitaxial growth can be performed by means of, for example, a CVD (Chemical Vapor Deposition) method in which a mixed gas of silane ($SiH_4$) and propane ($C_3H_8$) is used as a source material gas and hydrogen gas ($H_2$) is used as a carrier gas, for example. In doing so, it is preferable to introduce nitrogen (N) or phosphorus (P) as a donor, for example.

Figure 7:
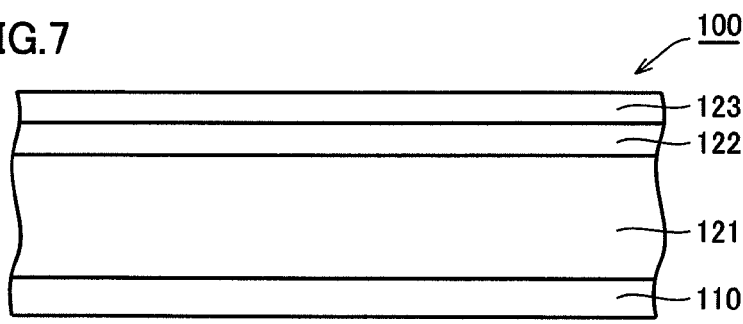
FIG. 7 is a partial cross sectional view schematically showing a second step of the method for manufacturing the silicon carbide semiconductor device of FIG. 1.

As shown in FIG. 7, p type body layer 122 is formed on n⁻ layer 121, and n region 123 is formed on p type body layer 122. Specifically, ion implantation is performed into the upper surface of n⁻ layer 121. In the ion implantation for forming p type body layer 122, ions of an acceptor such as aluminum (Al) are implanted. Meanwhile, in the ion implantation for forming n region 123, ions of a donor such as phosphorus (P) are implanted. Thus, epitaxial substrate 100 is formed which has n⁻ layer 121, p type body layer 122, and n region 123. It should be noted that instead of the ion implantation, epitaxial growth involving addition of impurities may be employed.

Figure 8:
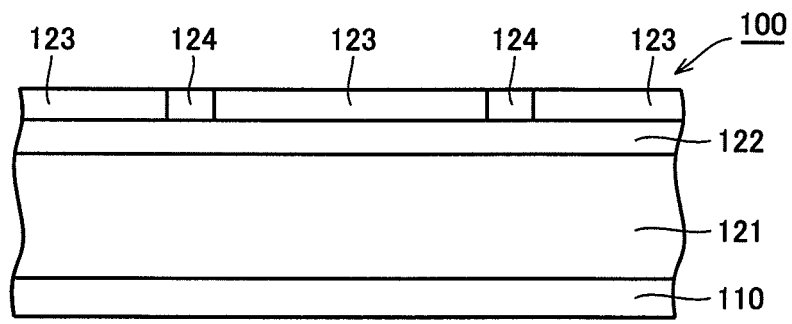
FIG. 8 is a partial cross sectional view schematically showing a third step of the method for manufacturing the silicon carbide semiconductor device of FIG. 1.

As shown in FIG. 8, contact regions 124 are formed by ion implantation. Next, activation heat treatment is performed to activate the impurities added by the ion implantation. This heat treatment is preferably performed at a temperature of not less than 1500° C. and not more than 1900° C., for example, a temperature of approximately 1700° C. The heat treatment is performed for approximately 30 minutes, for example. The atmosphere of the heat treatment is preferably an inert gas atmosphere, such as Ar atmosphere.

Figure 9:
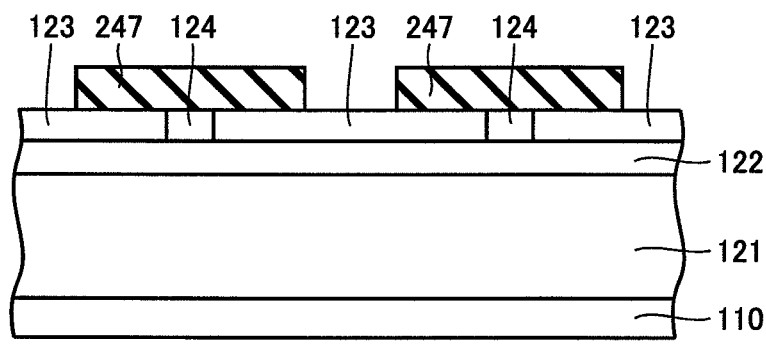
FIG. 9 is a partial cross sectional view schematically showing a fourth step of the method for manufacturing the silicon carbide semiconductor device of FIG. 1.

Next, a mask 247 (FIG. 9) having an opening through which n region 123 is partially exposed is formed on epitaxial substrate 100. The opening is formed to correspond to the location of trench TR (FIG. 1). As mask 247, a silicon oxide film formed by thermal oxidation can be used, for example.

Figure 10:
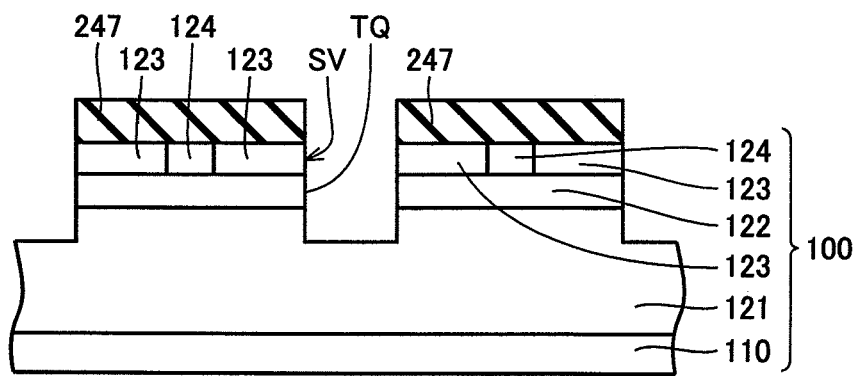
FIG. 10 is a partial cross sectional view schematically showing a fifth step of the method for manufacturing the silicon carbide semiconductor device of FIG. 1.

As shown in FIG. 10, in the opening of mask 247, n region 123, p type body layer 122, and a portion of n⁻ layer 121 are removed by etching. An exemplary, usable etching method is reactive ion etching (RIE), in particular, inductively coupled plasma (ICP) RIE. Specifically, ICP-RIE can be employed in which $SF_6$ or a mixed gas of $SF_6$ and $O_2$ is used as the reactive gas, for example. By means of such etching, in the region where trench TR (FIG. 1) is to be formed, a recess TQ can be formed which has a side wall having an inner surface SV substantially perpendicular to the main surface of single-crystal substrate 110.

Next, epitaxial substrate 100 is etched using mask 247. Specifically, inner surface SV of recess TQ of epitaxial substrate 100 is thermally etched. The thermal etching can be performed, for example, by heating epitaxial substrate 100 in an atmosphere including a reactive gas containing at least one or more types of halogen atom. The at least one or more types of halogen atom include at least one of chlorine (Cl) atom and fluorine (F) atom. This atmosphere is, for example, $Cl_2$, $BCL_3$, $SF_6$, or $CF_4$. For example, the thermal etching is performed using a mixed gas of chlorine gas and oxygen gas as a reactive gas, at a heat treatment temperature of, for example, not less than 700° C. and not more than 1000° C.

Figure 11:
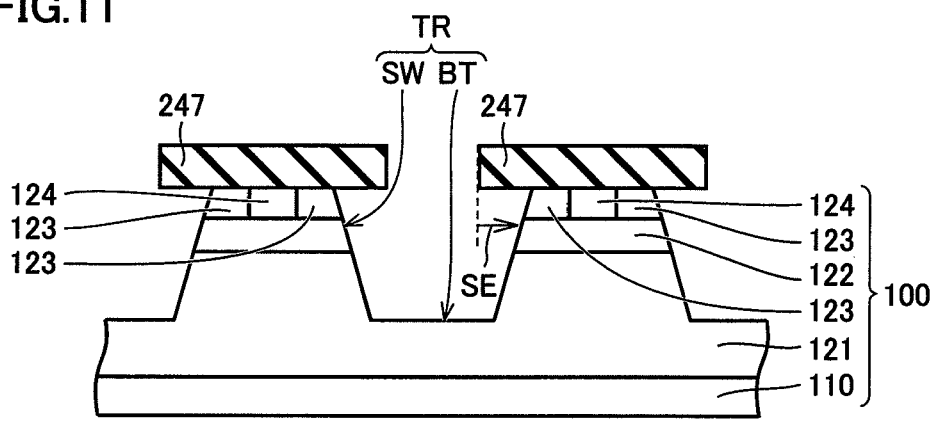
FIG. 11 is a partial cross sectional view schematically showing a sixth step of the method for manufacturing the silicon carbide semiconductor device of FIG. 1.

As a result of the thermal etching, trench TR is formed as shown in FIG. 11. During the formation of trench TR, epitaxial substrate 100 is etched in a side etching manner from the opening of mask 247 as indicated by an arrow SE. Further, during this thermal etching, a special plane is spontaneously formed on side wall surface SW of trench TR, in particular, on its portion formed of p type body layer 122.

It should be noted that the reactive gas may contain a carrier gas in addition to the chlorine gas and the oxygen gas. An exemplary, usable carrier gas is nitrogen ($N_2$) gas, argon gas, helium gas, or the like. When the heat treatment temperature is set at not less than 700° C. and not more than 1000° C. as described above, a rate of etching SiC is, for example, approximately 70 μm/hour. Moreover, in this case, mask 247, which is made of silicon oxide and therefore has a very large selection ratio relative to SiC, is not substantially etched during the etching of SiC.

Figure 12:
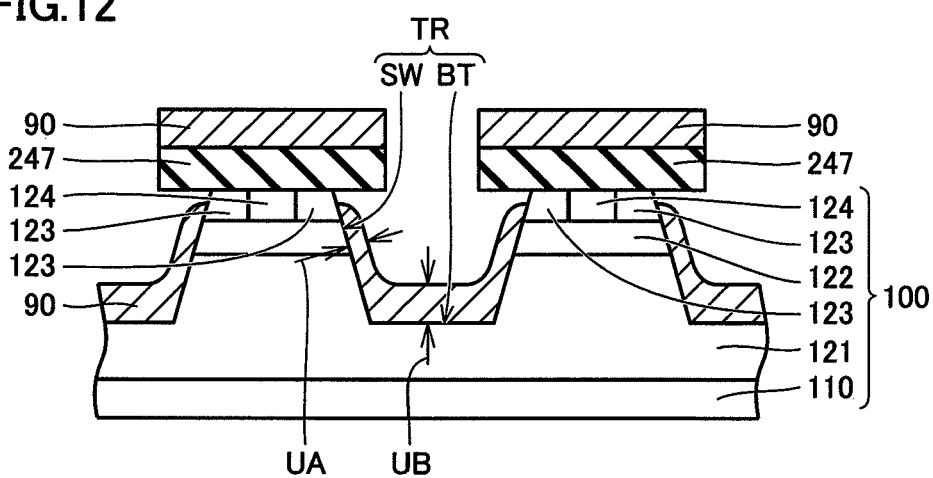
FIG. 12 is a partial cross sectional view schematically showing a seventh step of the method for manufacturing the silicon carbide semiconductor device of FIG. 1.

As shown in FIG. 12, a silicon film 90 is formed on epitaxial substrate 100 having mask 247 provided thereon. In other words, silicon film 90 is formed while using mask 247. Silicon film 90 covers bottom surface BT of trench TR. In the present embodiment, silicon film 90 also covers p type body layer 122 on side wall surface SW.

Silicon film 90 has a first thickness UB on bottom surface BT. Silicon film 90 has a second thickness UA on side wall surface SW formed of p type body layer 122. Side wall surface SW formed of p type body layer 122 is not directly covered with mask 247, but is located in the shadow of mask 247 during the formation of silicon film 90. Therefore, second thickness UA is smaller than first thickness UB. Conversely, first thickness UB is larger than second thickness UA. The silicon film is preferably made substantially only of silicon, but may be made of silicon containing an impurity.

Figure 13:
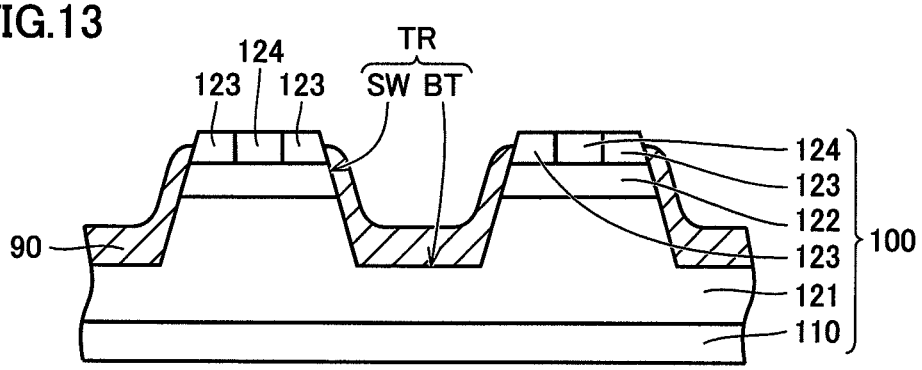
FIG. 13 is a partial cross sectional view schematically showing an eighth step of the method for manufacturing the silicon carbide semiconductor device of FIG. 1.

Next, mask 247 is removed with an appropriate method such as etching (FIG. 13). In doing so, the portion of silicon film 90 on mask 247 is also removed.

Next, a portion of silicon film 90 is removed such that silicon film 90 remains on bottom surface BT of trench TR and p type body layer 122 is exposed at side wall surface SW of trench TR. Specifically, the following steps are performed.

Figure 14:
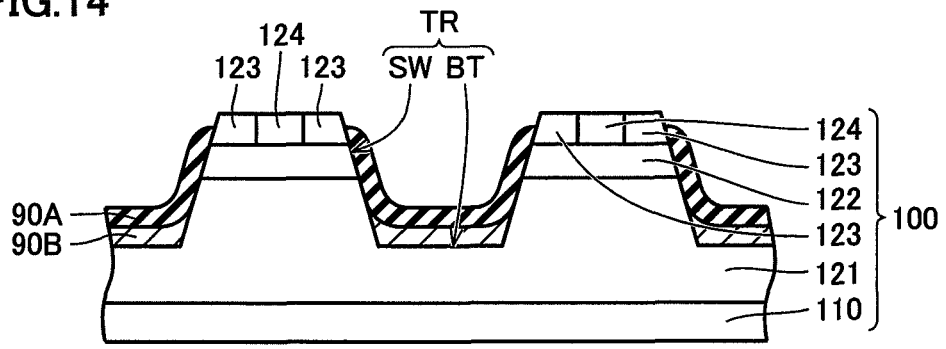
FIG. 14 is a partial cross sectional view schematically showing a ninth step of the method for manufacturing the silicon carbide semiconductor device of FIG. 1.
Figure 15:
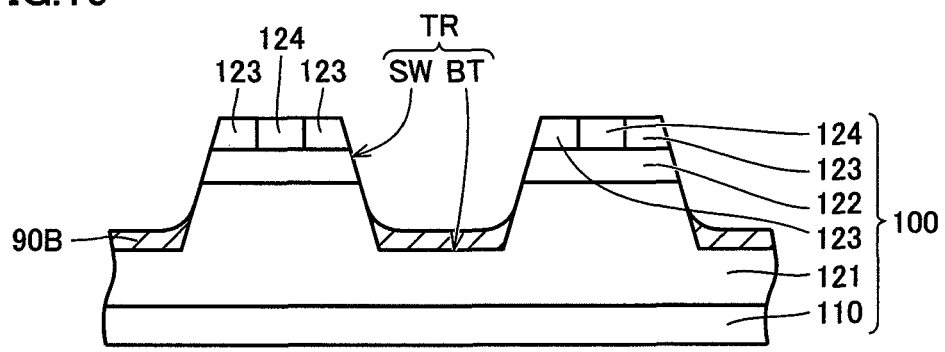
FIG. 15 is a partial cross sectional view schematically showing a tenth step of the method for manufacturing the silicon carbide semiconductor device of FIG. 1.

First, silicon film 90 (FIG. 13) is thermally oxidized such that the oxidation progresses to a thickness smaller than first thickness UB (FIG. 12) and larger than second thickness UA (FIG. 12). This thermal oxidation is preferably performed at a temperature at which silicon is thermally oxidized and silicon carbide is not substantially thermally oxidized. Consequently, on side wall surface SW, silicon film 90 having second thickness UA is oxidized as shown in FIG. 14. On bottom surface BT, a portion corresponding to second thickness UA of silicon film 90 having first thickness UB (FIG. 13) is oxidized to become a silicon oxide film 90A, and the remaining portion remains as a silicon film 90B. The entire portion of silicon film 90 that was located on side wall surface SW formed of p type body layer 122 becomes silicon oxide film 90A. The portion of silicon film 90 that was located on bottom surface BT partially becomes silicon oxide film 90A on the surface side, and silicon film 90B remains between silicon oxide film 90A and bottom surface BT. This thermal oxidation is performed, for example, at not less than 800° C. and not more than 950° C. Next, silicon oxide film 90A is removed by etching (FIG. 15). This removal can be performed, for example, by wet etching using hydrofluoric acid.

In the manner described above, a portion of silicon film 90 (FIG. 13) is removed such that silicon film 90 (i.e., silicon film 90B) remains on bottom surface BT of trench TR and p type body layer 122 is exposed at side wall surface SW of trench TR.

Next, oxidation is performed in trench TR, thereby forming gate oxide film 201 (FIG. 1) on the inner surface of trench TR. Specifically, the following steps are performed.

Figure 16:
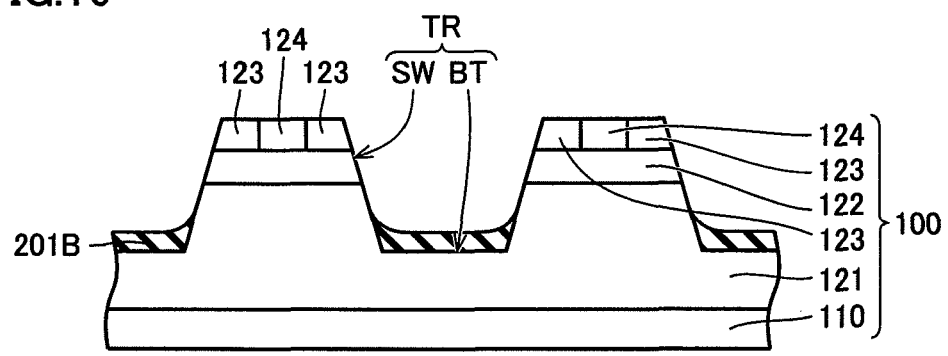
FIG. 16 is a partial cross sectional view schematically showing an eleventh step of the method for manufacturing the silicon carbide semiconductor device of FIG. 1.
Figure 17:
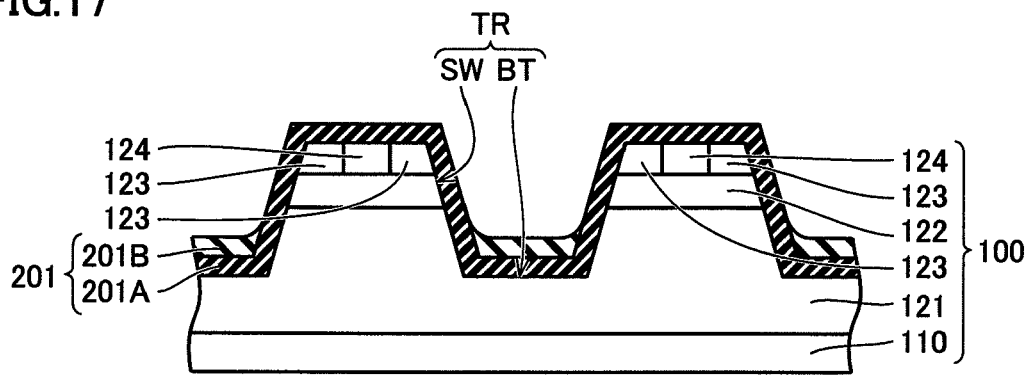
FIG. 17 is a partial cross sectional view schematically showing a twelfth step of the method for manufacturing the silicon carbide semiconductor device of FIG. 1.

First, silicon film 90B (FIG. 15) is thermally oxidized. Thus, second portion 201B that forms a portion of gate oxide film 201 (FIG. 1) is formed (FIG. 16). Silicon film 90B is thermally oxidized, for example, at not less than 800° C. and not more than 950° C. Next, as shown in FIG. 17, epitaxial substrate 100 made of silicon carbide is thermally oxidized, thereby forming first portion 201A of gate oxide film 201. Epitaxial substrate 100 is thermally oxidized preferably at a temperature higher than the temperature at which silicon film 90B is thermally oxidized, for example, is thermally oxidized at not less than 1300° C.

Gate oxide film 201 is formed in the manner described above.

Figure 18:
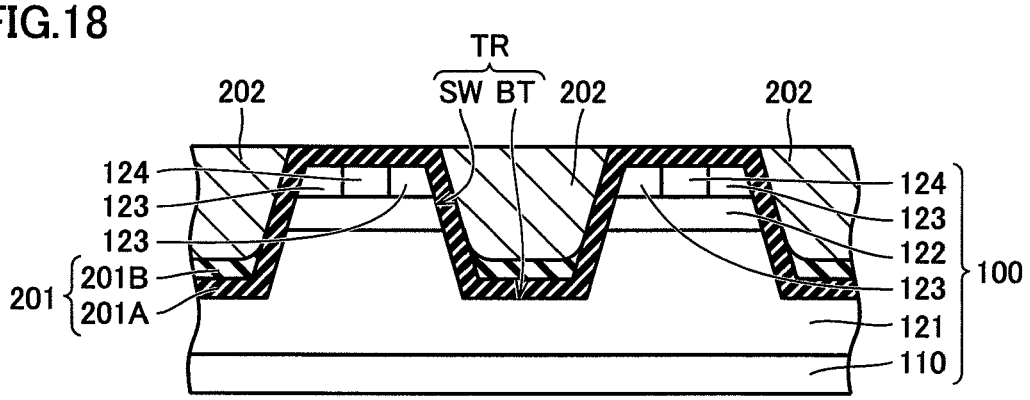
FIG. 18 is a partial cross sectional view schematically showing a thirteenth step of the method for manufacturing the silicon carbide semiconductor device of FIG. 1.

As shown in FIG. 18, gate electrode 202 is formed on gate oxide film 201. In the present embodiment, gate electrode 202 is formed in direct contact with first portion 201A on p type body layer 122. A method for forming gate electrode 202 can be performed, for example, by forming a film of conductor or doped polysilicon and performing CMP (Chemical Mechanical Polishing).

Figure 19:
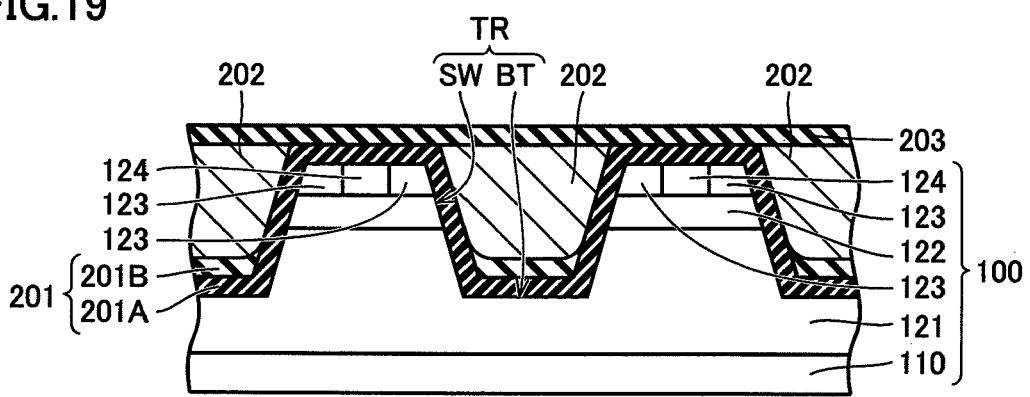
FIG. 19 is a partial cross sectional view schematically showing a fourteenth step of the method for manufacturing the silicon carbide semiconductor device of FIG. 1.

As shown in FIG. 19, interlayer insulating film 203 is formed on gate electrode 202 and gate oxide film 201 so as to cover the exposed surface of gate electrode 202.

Figure 20:
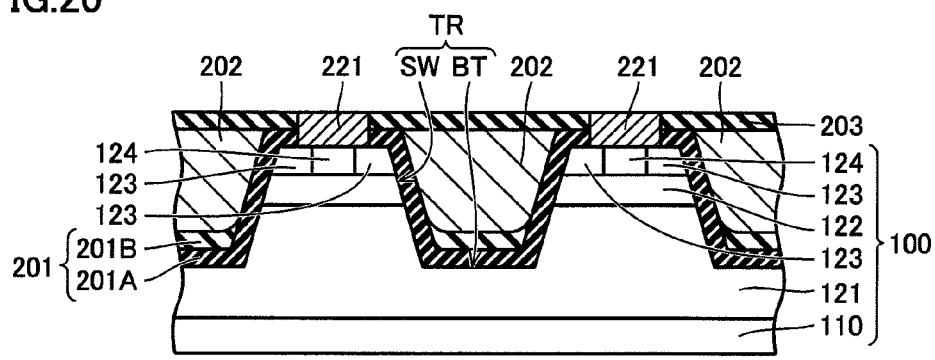
FIG. 20 is a partial cross sectional view schematically showing a fifteenth step of the method for manufacturing the silicon carbide semiconductor device of FIG. 1.

Referring to FIG. 20, etching is performed to form openings in interlayer insulating film 203 and gate oxide film 201. Through the opening, each of n region 123 and contact region 124 is exposed on the upper surface of the mesa structure. Next, on the upper surface of the mesa structure, source electrode 221 is formed in contact with each of n region 123 and contact region 124.

Referring to FIG. 1 again, source interconnection 222, drain electrode 211, and protecting electrode 212 are formed. In this way, MOSFET 500 is obtained.

According to MOSFET 500 (FIG. 1) of the present embodiment, gate oxide film 201 includes first portion 201A formed by the oxidation of epitaxial substrate 100, as well as second portion 201B formed by the oxidation of silicon film 90 on bottom surface BT of trench TR. Thus, the thickness of gate oxide film 201 on bottom surface BT of trench TR can be increased for the thickness of second portion 201B. That is, the thickness of a portion of the gate oxide film where breakdown particularly tends to occur can be increased. Accordingly, MOSFET 500 can have a high breakdown voltage.

Moreover, epitaxial substrate 100 is etched in a side etching manner from the opening of mask 247 (arrow SE in FIG. 11). That is, side wall surface SW of trench TR is recessed by the side etching. As a result, mask 247 remains protruding from side wall surface SW. During the formation of silicon film 90 using mask 247, therefore, silicon film 90 is unlikely to be formed on side wall surface SW since side wall surface SW is located in the shadow of mask 247.

Moreover, the step of forming silicon film 90 is performed using mask 247 (FIG. 12). Thus, the formation of silicon film 90 on the portion covered with mask 247 can be prevented.

Furthermore, in the present embodiment, silicon film 90 is formed to cover p type body layer 122 on side wall surface SW (FIG. 12). Then, a portion of silicon film 90 is removed such that silicon film 90 remains on bottom surface BT of trench TR and p type body layer 122 is exposed at side wall surface SW of trench TR (FIGS. 13 to 15). Thus, gate electrode 202 can make direct contact with first portion 201A on p type body layer 122.

Furthermore, silicon film 90 is formed to have first thickness UB on bottom surface BT and have second thickness UA on side wall surface SW formed of p type body layer 122 (FIG. 12). First thickness UB is larger than second thickness UA. Thus, second portion 201B can be formed with a further sufficient thickness on bottom surface BT.

Moreover, the step of removing a portion of silicon film 90 includes the following steps. Silicon film 90 is oxidized for a thickness smaller than first thickness UB and larger than second thickness UA (FIG. 14). A portion of silicon film 90 that has been oxidized in the step of oxidizing silicon film 90 is removed (FIG. 15). Thus, second portion 201B can be selectively formed on bottom surface BT rather than on side wall surface SW.

Furthermore, gate electrode 202 is formed in direct contact with first portion 201A on p type body layer 122 (FIG. 18). Thus, the gate insulating film on the channel surface formed of p body layer 122 can be formed only of first portion 201A higher in quality than second portion 201B.

Although the "first conductivity type" corresponds to n type conductivity and the "second conductivity type" corresponds to p type conductivity in the present embodiment, these conductivity types may be reversed. In this case, the donor and acceptor in the foregoing description are also reversed. It should be noted that in order to attain higher channel mobility, it is preferable that the "first conductivity type" corresponds to n type conductivity. In addition, the silicon carbide semiconductor device is not limited to the MOSFET, and may be a trench type IGBT (Insulated Gate Bipolar Transistor), for example.

(Surface Having Special Plane)

Figure 21:
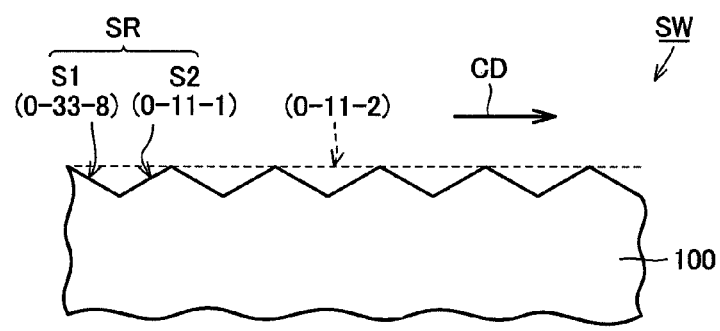
FIG. 21 is a partial cross sectional view schematically showing a fine structure in a surface of a silicon carbide substrate included in the silicon carbide semiconductor device.

As described above, side wall surface SW (FIG. 1) of trench TR preferably has a predetermined crystal plane (also referred to as "special plane") on, in particular, p type body layer 122. Such a side wall surface SW includes a plane S1 (first plane) having a plane orientation of {0-33-8} as shown in FIG. 21. Plane S1 preferably has a plane orientation of (0-33-8).

More preferably, side wall surface SW microscopically includes plane S1, and side wall surface SW microscopically further includes a plane S2 (second plane) having a plane orientation of 10-11-11. Here, the term "microscopically" refers to "minutely to such an extent that at least the size about twice as large as an interatomic spacing is considered". As a method for observing such a microscopic structure, for example, a TEM (Transmission Electron Microscope) can be used. Preferably, plane S2 has a plane orientation of (0-11-1).

Preferably, plane S1 and plane S2 of side wall surface SW form a combined plane SR having a plane orientation of 10-11-21. Specifically, combined plane SR is formed of periodically repeated planes S1 and S2. Such a periodic structure can be observed, for example, by TEM or AFM (Atomic Force Microscopy). In this case, combined plane SR has an off angle of 62° relative to the 1000-11 plane, macroscopically. Here, the term "macroscopically" refers to "disregarding a fine structure having a size of approximately interatomic spacing." For the measurement of such a macroscopic off angle, a method employing general X-ray diffraction can be used, for example. Preferably, combined plane SR has a plane orientation of (0-11-2). In this case, combined plane SR has an off angle of 62° relative to the (000-1) plane, macroscopically.

Preferably, in the channel surface, carriers flow in a channel direction CD, in which the above-described periodic repetition is done.

A detailed structure of combined plane SR is now described.

Figure 22:
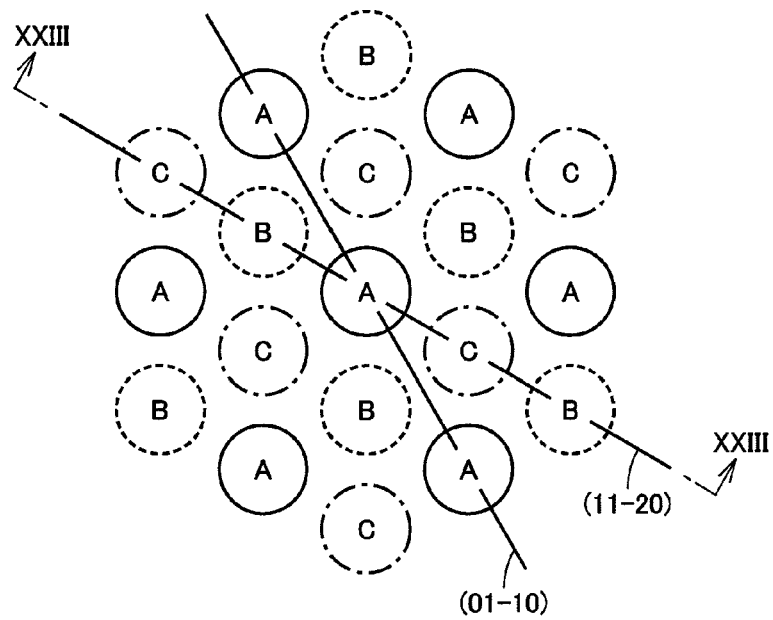
FIG. 22 shows a crystal structure of a (000-1) plane in a hexagonal crystal of polytype 4H.

Generally, regarding Si atoms (or C atoms), when viewing a silicon carbide single crystal of polytype 4H from the (000-1) plane, atoms in a layer A (solid line in the figure), atoms in a layer B (broken line in the figure) disposed therebelow, and atoms in a layer C (chain-dotted line in the figure) disposed therebelow, and atoms in a layer B (not shown in the figure) disposed therebelow are repeatedly provided as shown in FIG. 22. In other words, with four layers ABCB being regarded as one period, a periodic stacking structure such as ABCBABCBABCB . . . is provided.

Figure 23:
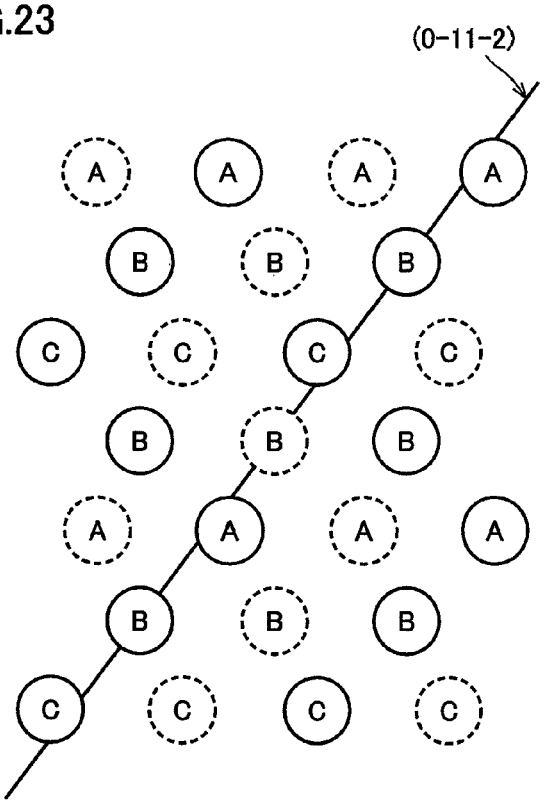
FIG. 23 shows a crystal structure of a (11-20) plane along a line XXIII-XXIII in FIG. 22.

As shown in FIG. 23, in the (11-20) plane (cross section taken along a line XXIII-XXIII of FIG. 22), atoms in each of four layers ABCB constituting the above-described one period are not aligned completely along the (0-11-2) plane. In FIG. 23, the (0-11-2) plane is illustrated to pass through the locations of the atoms in layers B. In this case, it is understood that each of atoms in layers A and C is deviated from the (0-11-2) plane. Hence, even when the macroscopic plane orientation of the surface of the silicon carbide single crystal, i.e., the plane orientation thereof with its atomic level structure being ignored is limited to (0-11-2), this surface can have various structures microscopically.

Figure 24:
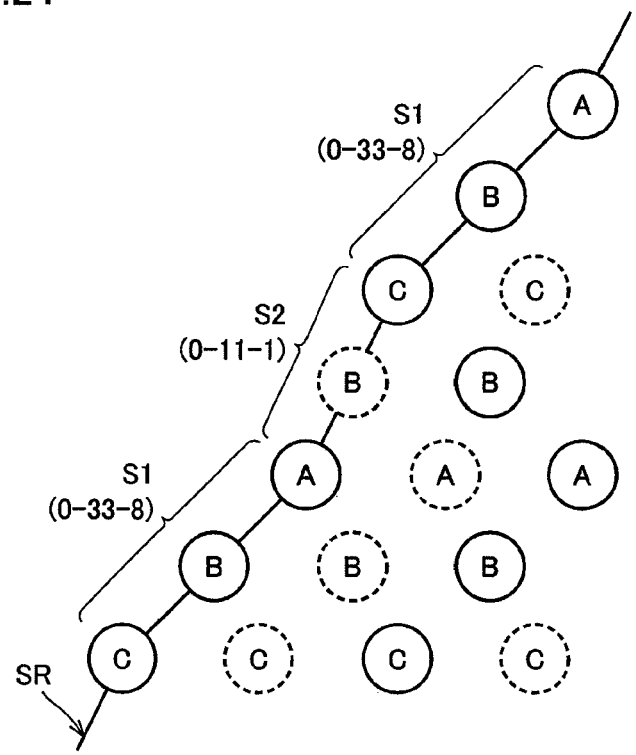
FIG. 24 shows a crystal structure of a combined plane of FIG. 21 in the vicinity of the surface within the (11-20) plane.

As shown in FIG. 24, combined plane SR is constructed by alternately providing planes S1 having a plane orientation of (0-33-8) and planes S2 connected to planes S1 and having a plane orientation different from that of each of planes S1. Each of planes S1 and S2 has a length twice as large as the interatomic spacing of the Si atoms (or C atoms). It should be noted that a plane with plane S1 and plane S2 being averaged corresponds to the (0-11-2) plane (FIG. 23).

Figure 25:
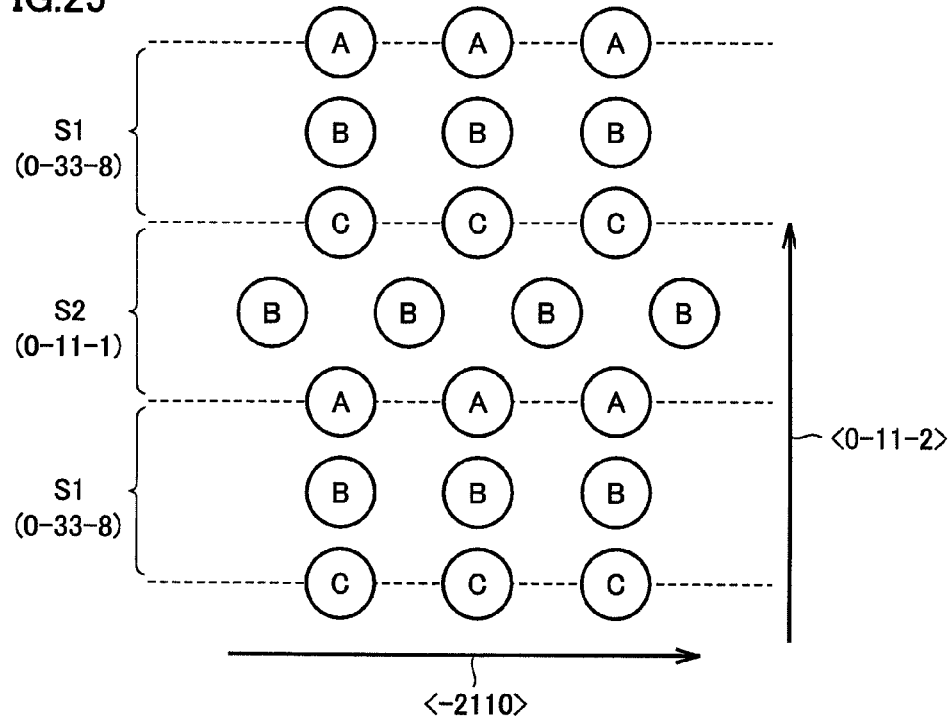
FIG. 25 shows the combined plane of FIG. 21 when viewed from a (01-10) plane.

As shown in FIG. 25, when viewing combined plane SR from the (01-10) plane, the single-crystal structure has a portion periodically including a structure (plane S1 portion) equivalent to a cubic structure. Specifically, combined plane SR is constructed by alternately providing planes S1 having a plane orientation of (001) in the above-described structure equivalent to the cubic structure and planes S2 connected to planes S1 and having a plane orientation different from that of each of planes S1. Also in a polytype other than 4H, the surface can be formed of the planes (planes S1 in FIG. 25) having a plane orientation of (001) in the structure equivalent to the cubic structure and the planes (planes S2 in FIG. 25) connected to the foregoing planes and having a plane orientation different from that of each of the foregoing planes. The polytype may be, for example, 6H or 15R.

Figure 26:
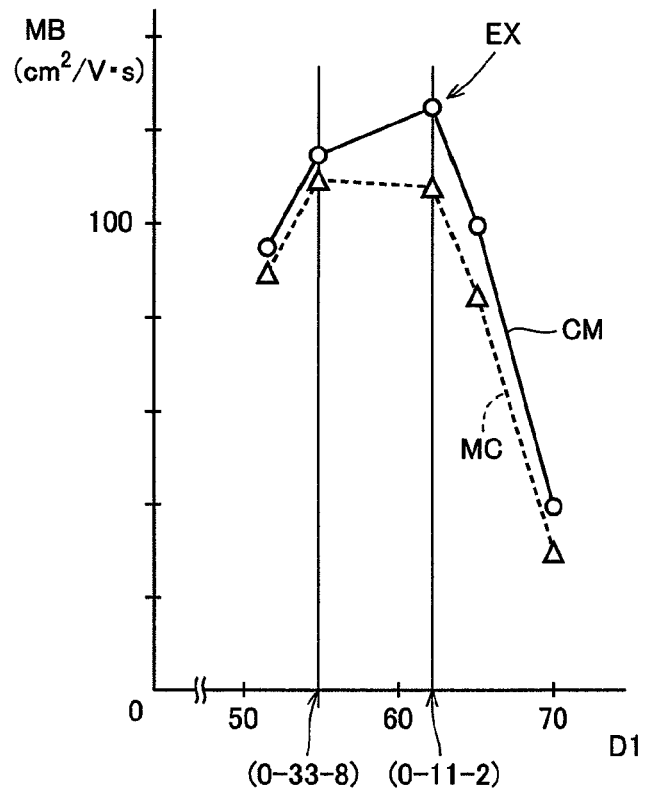
FIG. 26 is a graph showing an exemplary relation between channel mobility and an angle between a channel surface and the (000-1) plane when macroscopically viewed, in each of a case where thermal etching is performed and a case where no thermal etching is performed.

Referring to FIG. 26, a relation between the crystal plane of side wall surface SW and mobility MB of the channel surface is described. In the graph of FIG. 26, the horizontal axis represents an angle D1 formed by the (000-1) plane and the macroscopic plane orientation of side wall surface SW having the channel surface, whereas the vertical axis represents mobility MB. A group of plots CM corresponds to a case where side wall surface SW is finished to correspond to a special plane by thermal etching, whereas a group of plots MC corresponds to a case where side wall surface SW is not thermally etched.

In group of plots MC, mobility MB is at maximum when the surface of the channel surface has a macroscopic plane orientation of (0-33-8). This is presumably due to the following reason. That is, in the case where the thermal etching is not performed, i.e., in the case where the microscopic structure of the channel surface is not particularly controlled, the macroscopic plane orientation thereof corresponds to (0-33-8), with the result that a ratio of the microscopic plane orientation of (0-33-8), i.e., the plane orientation of (0-33-8) in consideration of that in atomic level becomes statistically high.

On the other hand, mobility MB in group of plots CM is at maximum when the macroscopic plane orientation of the channel surface is (0-11-2) (arrow EX). This is presumably due to the following reason. That is, as shown in FIG. 24 and FIG. 25, the multiplicity of planes S1 each having a plane orientation of (0-33-8) are densely and regularly arranged with planes S2 interposed therebetween, whereby a ratio of the microscopic plane orientation of (0-33-8) becomes high in the surface of the channel surface.

Figure 27:
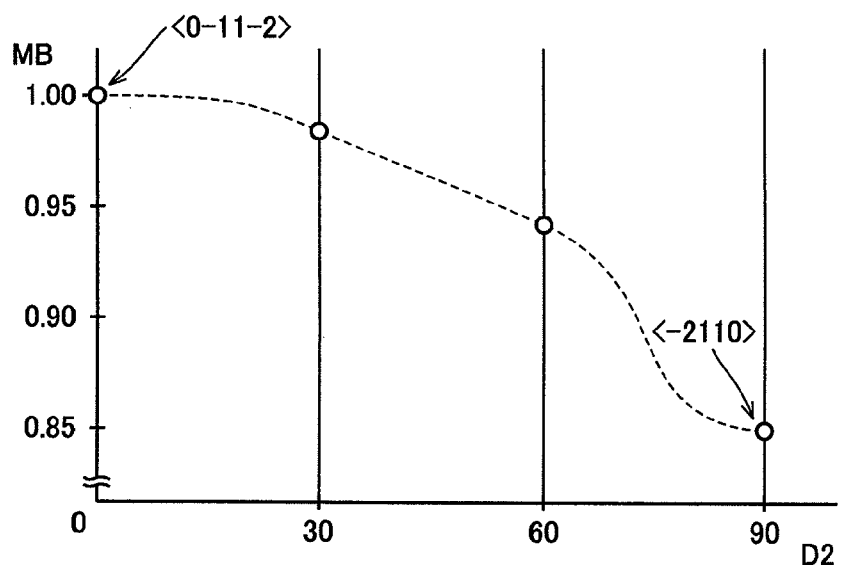
FIG. 27 is a graph showing an exemplary relation between the channel mobility and an angle between a channel direction and a <0-11-2> direction.

It should be noted that mobility MB has orientation dependency on combined plane SR. In a graph shown in FIG. 27, the horizontal axis represents an angle D2 between the channel direction and the <0-11-2> direction, whereas the vertical axis represents mobility MB (in any unit) in the channel surface. A broken line is supplementarily provided therein for viewability of the graph. From this graph, it has been found that in order to increase channel mobility MB, channel direction CD (FIG. 21) preferably has an angle D2 of not less than 0° and not more than 60°, more preferably, substantially 0°.

Figure 28:
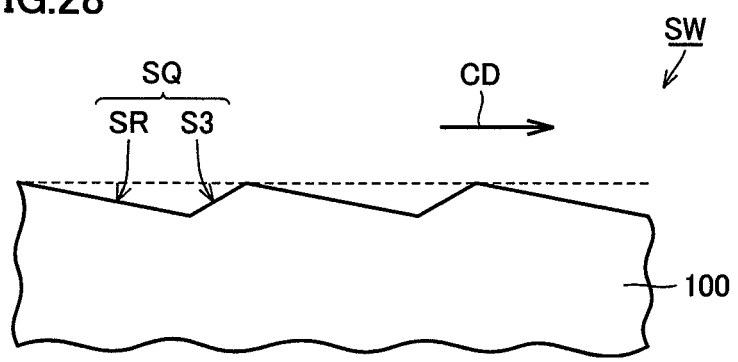
FIG. 28 shows a modification of FIG. 21.

As shown in FIG. 28, side wall surface SW may further include plane S3 (third plane) in addition to combined plane SR. More specifically, side wall surface SW may include a combined plane SQ formed of periodically repeated plane S3 and combined plane SR. In this case, the off angle of side wall surface SW relative to the {000-1} plane is deviated from the ideal off angle of combined plane SR, i.e., 62°. Preferably, this deviation is small, preferably, in a range of ±10°. Examples of a surface included in such an angle range include a surface having a macroscopic plane orientation of the {0-33-8} plane. More preferably, the off angle of side wall surface SW relative to the (000-1) plane is deviated from the ideal off angle of combined plane SR, i.e., 62°. Preferably, this deviation is small, preferably, in a range of ±10°. Examples of a surface included in such an angle range include a surface having a macroscopic plane orientation of the (0-33-8) plane.

Such a periodic structure can be observed, for example, by TEM or AFM.

Although the present invention has been described and illustrated in detail, it is clearly understood that the same is by way of illustration and example only and is not to be taken by way of limitation, the scope of the present invention being interpreted by the terms of the appended claims.

What is claimed is:

1. A silicon carbide semiconductor device, comprising:
   a silicon carbide substrate having an epitaxial layer;
   a trench formed at said epitaxial layer having a side wall surface, a bottom surface, and a first corner portion between said side wall surface and said bottom surface;
   a gate oxide film on an inner surface of said trench, said gate oxide film including a first portion extending on both said side wall surface and said bottom surface and a second portion on said first portion located on said bottom surface; and
   a gate electrode on said gate oxide film,
   said first portion having a second corner portion, covered with said second portion, at an upper surface of said first portion, said second portion having a third corner portion at an upper surface of said second portion, and a radius of curvature of said third corner portion being greater than a radius of curvature of said second corner portion.

2. The silicon carbide semiconductor device according to claim 1, wherein a carbon atom concentration of said second portion is lower than a carbon atom concentration of said first portion.

3. The silicon carbide semiconductor device according to claim 1, wherein a total thickness of said first portion and said second portion above said bottom surface is larger than a thickness of said first portion above said side wall surface by 300 nm or more.

4. The silicon carbide semiconductor device according to claim 1, wherein said epitaxial layer includes a first layer of a first conductivity type, a second layer of a second conductivity type on said first layer, and a third layer of said first conductivity type on said second layer,
   said first corner portion locates at said first layer, said first portion extends from on said first layer to on said third layer, said second portion lies covering said first layer and does not extend on said second layer.

5. The silicon carbide semiconductor device according to claim 1, wherein said second portion has a central part and a pair of side end parts on said bottom surface of said trench, said central part is located between said side end parts, a thickness of each of said side end parts is greater than a thickness of said central part.

6. The silicon carbide semiconductor device according to claim 5, wherein said side end parts extend from on said first portion located on said bottom surface of said trench to said first portion located on said side wall surface of said trench.

7. The silicon carbide semiconductor device according to claim 1, wherein said second portion has a central part and a pair of side end parts on said bottom surface of said trench, each of said side end parts has said third corner portion on an upper surface thereof.

8. A silicon carbide semiconductor device, comprising:
   a silicon carbide substrate having an epitaxial layer;
   a trench formed at said epitaxial layer having a side wall surface, a bottom surface, and a first corner portion between said side wall surface and said bottom surface;
   a gate oxide film on an inner surface of said trench, said gate oxide film including a first portion extending continuously from on said side wall surface to on said bottom surface and a second portion extending from on said first portion located on said bottom surface to on a part of said first portion located on said side wall surface; and
   a gate electrode on said gate oxide film to contact said second portion and said first portion located on said side wall surface;
   said first portion covering said first corner portion and having a second corner portion at a side end part of an upper surface of said first portion located on said bottom surface, said second portion covering said second corner portion, said second portion having a third corner portion at a side end part of an upper surface of said second portion, said second portion having a central part, a thickness of said side end part of said second portion being greater than a thickness of said central part of said second portion, and a radius of curvature of said third corner portion being greater than a radius of curvature of said second corner portion.

9. The silicon carbide semiconductor device according to claim 8, wherein a carbon atom concentration of said second portion is lower than a carbon atom concentration of said first portion.

* * * * *